(12) United States Patent
Nakanishi

(10) Patent No.: US 7,714,973 B2
(45) Date of Patent: May 11, 2010

(54) LIQUID CRYSTAL DISPLAY DEVICE AND MANUFACTURING METHOD THEREOF

(75) Inventor: Futoshi Nakanishi, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 484 days.

(21) Appl. No.: 11/655,979

(22) Filed: Jan. 22, 2007

(65) Prior Publication Data

US 2007/0171347 A1 Jul. 26, 2007

(30) Foreign Application Priority Data

Jan. 23, 2006 (JP) .............................. 2006-013822

(51) Int. Cl.
*G02F 1/1345* (2006.01)

(52) U.S. Cl. ........................ 349/150; 349/149

(58) Field of Classification Search ................ None
See application file for complete search history.

(56) References Cited

U.S. PATENT DOCUMENTS

| | | | | |
|---|---|---|---|---|
| 5,668,700 | A * | 9/1997 | Tagusa et al. ............... | 361/779 |
| 6,172,730 | B1 * | 1/2001 | Fujita ......................... | 349/149 |
| 6,806,936 | B2 * | 10/2004 | Nakaminami et al. ....... | 349/149 |
| 2005/0006650 | A1 * | 1/2005 | Choi et al. .................... | 257/77 |
| 2005/0162603 | A1 * | 7/2005 | Cheng et al. ................. | 349/149 |
| 2007/0126970 | A1 * | 6/2007 | Shie ........................... | 349/149 |

FOREIGN PATENT DOCUMENTS

| | | | |
|---|---|---|---|
| JP | 8-138774 A | * | 5/1996 |
| JP | 11-288750 A | * | 10/1999 |
| JP | 2001-305568 A | * | 10/2001 |
| JP | 2002-358026 | | 12/2002 |

* cited by examiner

*Primary Examiner*—Mike Stahl
(74) *Attorney, Agent, or Firm*—McGinn IP Law Group, PLLC

(57) ABSTRACT

A liquid crystal display device of the present invention prevents certainly disconnection and electrical short of a wiring pattern of a flexible wiring board, and enhances bond strength between a liquid crystal panel and the flexible wiring board. A liquid crystal panel is provided with substrates, a liquid crystal and external connection terminals formed on one substrate. A flexible wiring board includes a wiring pattern connected with the external connection terminals of the liquid crystal panel. An anisotropic conductive film electrically connects between the external connection terminals of the liquid crystal panel and the wiring pattern of the flexible wiring board. And the anisotropic conductive film is extended from a formation area of the external connection terminals to an outside area along the flexible wiring board.

17 Claims, 4 Drawing Sheets

LIQUID CRYSTAL DISPLAY DEVICE AND MANUFACTURING METHOD THEREOF

FIELD OF THE INVENTION

The present invention relates to a liquid crystal display device and a manufacturing method thereof, more particularly to a connection structure and a connection method between a liquid crystal panel and a flexible wiring board.

DESCRIPTION OF THE RELATED ART

Heretofore, a liquid crystal display device has features of thin shape, light weight and low power consumption, and has a wide array of uses, such as office automation equipment, audiovisual equipment, mobile terminal, and so on. Generally, the liquid crystal display device includes a liquid crystal panel having a liquid crystal and a pair of substrates which sandwiches the liquid crystal, and further includes a backlight which illuminates the liquid crystal panel, a housing which holds the liquid crystal panel, and a circuit board which has a drive circuit for driving the liquid crystal panel.

In the above liquid crystal display device, if the circuit board is arranged at the periphery of the liquid crystal panel, a size of the whole liquid crystal display device becomes large. Consequently, in the conventional liquid crystal display device, the circuit board is arranged in the back side of the liquid crystal panel, and a flexible wiring board is used for connecting between the liquid crystal panel and the circuit board.

The flexible wiring board has an arrangement in which a wiring pattern evaporated with copper (Cu) foil is formed on a base material which is made of polymer, such as polyimide or the like. The flexible wiring board is connected to external connection terminals arranged at a periphery of the liquid crystal panel by using an anisotropic conductive film. The anisotropic conductive film is thermosetting resin film, in which conductive particles are dispersed.

Next, a description will be given in detail of a connection structure between a flexible wiring board and a liquid crystal panel in a conventional liquid crystal display device with reference to FIGS. 6 and 7. FIG. 6 is a cross-sectional diagram showing a connection structure bonding a liquid crystal panel and a flexible wiring board in a conventional liquid crystal display device. And FIG. 7 is a sectional pattern diagram showing a connection method at the time of hot-pressing in a liquid crystal display device shown in FIG. 6.

In FIG. 6, the conventional liquid crystal display device 1 includes a liquid crystal panel 3 having substrates 2a, 2b which sandwiches a liquid crystal, a flexible wiring board 4. The liquid crystal panel 3 and the flexible wiring board 4 are connected with a mutual electrode terminal by using an anisotropic conductive film 5.

Here, the anisotropic conductive film 5 is stuck only to a formation area of the external connection terminals of the liquid crystal panel 3. For this reason, there are some problems.

For example, in order that the flexible wiring board 4 is used for connecting between the liquid crystal panel 3 and a circuit board backside of the liquid crystal panel 3, a wiring pattern of the flexible wiring board 4 is under bending stress. Particularly, as the flexible wiring board 4 becomes thin, there is a problem that the wiring pattern is disconnected. Also, since the wiring pattern is exposed at an end of the flexible wiring board 4 to connect to an external connection terminals 11 of the liquid crystal panel 3, there is a further problem that the exposed wiring pattern shorts by adhesion of a conductive foreign body.

In order to solve the problems of the disconnection and electrical short, a method of protecting the exposed wiring pattern of the flexible wiring board by coating a protection resin after connecting the flexible wiring board is used. Also, other technology to prevent the disconnection and electrical short is disclosed in Japanese published unexamined application 2002-358026. The display device disclosed in JP 2002-358026 has a protection resin (solder resist) for protecting a Cu foil pattern on a base material of the flexible wiring board so that the solder resist is extended inside the liquid crystal panel while having the flexible wiring board connected to the liquid crystal panel.

However, as for a method of protecting the exposed wiring pattern by coating protection resin after connecting the flexible wiring board, it is difficult to coat the exposed portion of the wiring pattern certainly. Therefore, there is a problem that a manufacturing process and manufacture cost increase.

Also, as for a method disclosed in JP 2002-358026, the solder resist is extended inside the liquid crystal panel or else is formed near the external connection terminals 11 of the liquid crystal panel. Therefore, as diffusion of the anisotropic conductive film is barred by the insulating protection film, there is a problem that an electrical short by the superfluous conductive particle may occur.

Moreover, besides the above-mentioned problem of the disconnection or electrical short, when a housing of the liquid crystal display device becomes small and a formation area of the external connection terminals 11 becomes small, a contact area for connecting between the liquid crystal panel and the flexible wiring board becomes small. Therefore, there is a problem that bond strength between the liquid crystal panel and the flexible wiring board is not fully securable.

SUMMARY OF THE INVENTION

The present invention has been made to solve the above and other exemplary problems, and therefore an exemplary feature of the present invention is to prevent certainly the disconnection and electrical short of a wiring pattern of a flexible wiring board, and to enhance bond strength between a liquid crystal panel and a flexible wiring board.

In order to attain the above-mentioned and other exemplary features, the present invention provides an exemplary liquid crystal display device. The liquid crystal display device includes: a liquid crystal panel which is provided with a substrate, a liquid crystal and external connection terminals formed on the substrate; a flexible wiring board which includes a wiring pattern connected with the external connection terminals of the liquid crystal panel; and an anisotropic conductive film which electrically connects between the external connection terminals of the liquid crystal panel and the wiring pattern of the flexible wiring board. And the anisotropic conductive film is formed from a formation area of the external connection terminals to an outside area along the flexible wiring board.

Also, in order to attain the above-mentioned and other exemplary features, the present invention provides an exemplary manufacturing method of a liquid crystal display device. The manufacturing method includes: setting a liquid crystal panel which is provided with a substrate, a liquid crystal and external connection terminals formed on the substrate;

sticking an anisotropic conductive film on a formation area of the external connection terminals; attaching a flexible wiring board on the anisotropic conductive film at position aligned with the external connection terminals of the liquid crystal panel; attaching a cushioning on the flexible wiring board; setting a hot-pressing tool above the cushioning; and thermo-compressing to a stuck area of the anisotropic conductive film by using the hot-depressing tool. And the anisotropic conductive film is formed from a formation area of the external connection terminals to an outside area along the flexible wiring board.

Furthermore, in order to attain the above-mentioned and other exemplary features, the present invention provides an exemplary manufacturing method of a liquid crystal display device. The manufacturing method includes: setting a liquid crystal panel which is provided with a substrate, a liquid crystal and external connection terminals formed on the substrate; sticking an anisotropic conductive film on a formation area of the external connection terminals; attaching a flexible wiring board on the anisotropic conductive film at position aligned with the external connection terminals of the liquid crystal panel; attaching a cushioning on the flexible wiring board; setting a hot-pressing tool above the cushioning at inside the liquid crystal panel; setting a pressing tool the cushioning at outside the liquid crystal panel; and thermo-compressing to a stuck area of the anisotropic conductive film. And the anisotropic conductive film is formed from a formation area of the external connection terminals to an outside area along the flexible wiring board.

According to the above configuration, the exemplary liquid crystal display device of the present invention can prevent a disconnection of a wiring pattern by bending, for reasons that the wiring pattern may not contact an edge of the liquid crystal panel directly. Also, the exemplary liquid crystal display device of the present invention can prevent an electrical short of the wiring pattern formed on the flexible wiring board, for reasons that the wiring pattern of the flexible wiring board may be completely covered by the anisotropic conductive film and does not have adhesion of a conductive foreign substance. Furthermore, the exemplary liquid crystal display device of the present invention enhances bond strength, for reasons that the contact area of the liquid crystal panel and the flexible board may enlarge.

BRIEF DESCRIPTION OF THE DRAWINGS

The above and other exemplary features, and advantages of the present invention will become more apparent from the following detailed description when taken in conjunction with the accompanying drawings wherein.

DETAILED DESCRIPTION OF THE EXEMPLARY EMBODIMENTS

Figure 1:
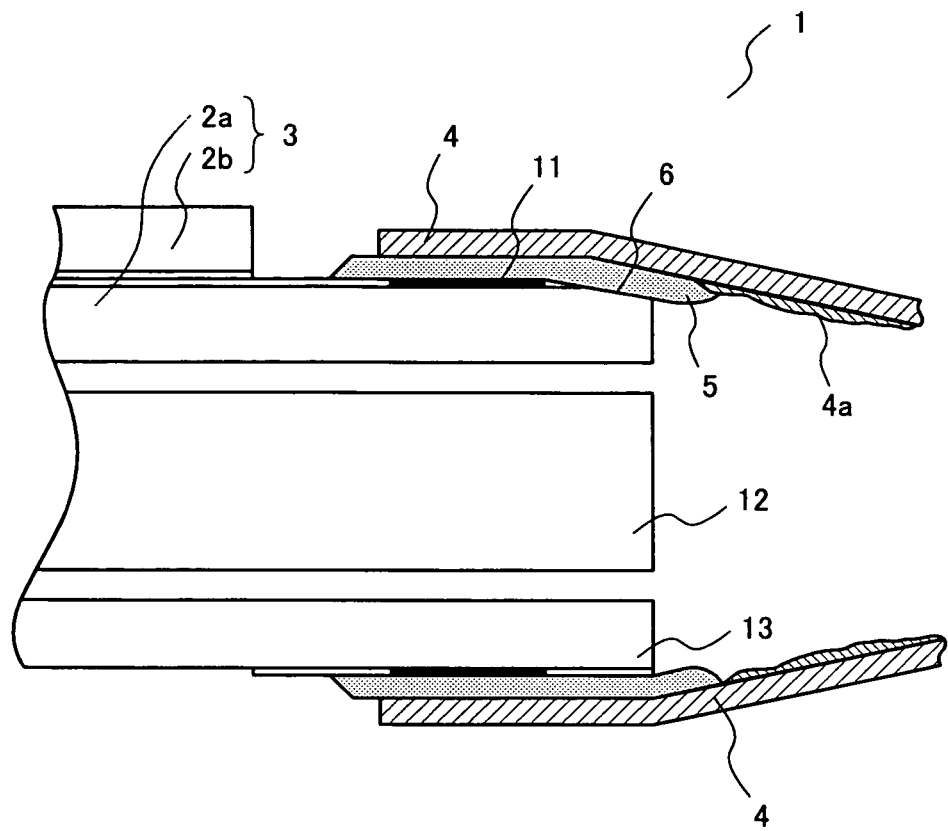
FIG. 1 is a cross-sectional pattern diagram showing an exemplary embodiment of a connection structure bonding a liquid crystal panel and a flexible wiring board in a liquid crystal display device according to the present invention.

Hereinafter, a description will be given in more detail of an exemplary liquid crystal display device according to the present invention with reference to the accompanying drawings. FIG. 1 is a cross-sectional pattern diagram showing an exemplary embodiment of a connection structure bonding a liquid crystal panel and a flexible wiring board in a liquid crystal display device according to the present invention.

Referring to FIG. 1, a liquid crystal display device 1 of the exemplary embodiment includes a liquid crystal panel 3, a back light 12, an optical element (not shown), a circuit board 13, a flexible wiring board 4, and a housing (not shown) which holds each composition unit. The liquid crystal panel 3 includes a substrate 2a which switching elements (for example, Thin Film Transistor) are formed, another substrate 2b which a color filter, a black matrix, and so on are formed, and a liquid crystal sandwiched between both the substrates (substrates 2a and 2b). The back light 12 includes a lamp used as a light source and an optical waveguide, and so on. The optical element includes a diffusion sheet, a lens sheet, a polarizing sheet, and so on. The circuit board 13 drives the liquid crystal panel 3. The flexible wiring board 4 connects the liquid crystal panel 3 and the circuit board 13.

Also, the flexible wiring board 4 includes a flexible base material such as a resin film (for example, polyimide), a wiring pattern evaporated with copper foil on the flexible base material, a insulating protection film 4a to protect the wiring patterns. The flexible wiring board 4 is bent outside the liquid crystal panel 3, and is connected to the circuit board 13 provided at the backside of the liquid crystal display device 1. On either a surface or a back face of the flexible wiring board 4, a driver circuit driving the liquid crystal panel 3 is possibly mounted.

The liquid crystal panel 3 includes external connection terminals 11 arranged with corresponding to a pixel array which constitutes a display on the periphery of one substrate (for example, substrate 2a) of the liquid crystal panel 3. The external connection terminals 11 are connected with exposed terminals or portions of the wiring pattern of the flexible wiring board 4 by using of an anisotropic conductive film 5 formed on the substrate 2a. The anisotropic conductive film is thermosetting resin film, in which conductive particles are dispersed.

Here, as shown in FIG. 1, in the liquid crystal display device 1 of the exemplary embodiment of the present invention, the insulating protection film 4a is formed at predetermined distance away from the edge of the liquid crystal panel 3, and the anisotropic conductive film 5 is stuck on a formation portion of the external connection terminal 11 of the liquid crystal panel 3 and protrudes to the outside portion or area of an edge of the liquid crystal panel 3 along the flexible wiring board 4. And, the liquid crystal panel 3 has a chamfer 6 at near the external connection terminals 11.

Moreover, the anisotropic conductive film 5, on the one hand (right hand in FIG. 1), is extended to overlap with a part of the insulating protection film 4a of the flexible wiring board 4, and on the other hand (left hand in FIG. 1), is stuck to protrude from an end of the flexible wiring board 4. Also, the liquid crystal panel 3 is chamfered at angle of about 20 to 70 degrees (chamfer 6). The flexible wiring board 4 is bended along the chamfer 6, and is bonded by the anisotropic conductive film 5 at a flat and the chamfer 6 of the liquid crystal panel 3.

According to the structure described above, since the exposed portions of the wiring pattern of the flexible wiring board 4 is everywhere covered by the anisotropic conductive film 5, the electrical short by a conductive dust adhering to the exposed wiring pattern can be prevented. Also, disconnection by a wiring pattern contacting the edge of the liquid crystal panel 3 can be prevented. Furthermore, since the flexible wiring board 4 is bonded in the large area from the formation area of the external connection terminals 11 to the chamfer 6 of the liquid crystal panel 3 by using the anisotropic conductive film 5, bond strength can be enhanced and higher tolerance to flexure stress is obtainable.

The structure of FIG. 1 is exemplification, in the range which satisfies the meaning of the present invention, change of the following setting or conditions is possible. As for the liquid crystal panel 3, structure, terminal-forming area, and positional relation between the liquid crystal panel 3 and the flexible wiring board 4 is included. As for the flexible wiring board 4, used number, thickness, bended geometry, base material and its component ratio, and base material and thickness of wiring pattern is included. As for the anisotropic conductive film 5, thickness, base material and its component ratio, and bonding condition is included. As for the insulating protection film 4a, base material and its component ratio, and forming area (exposed area) is included.

Figure 2:
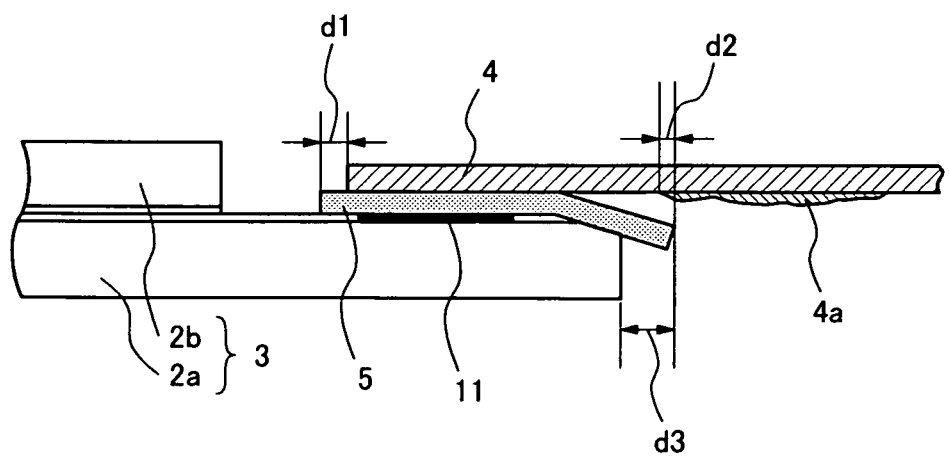
FIG. 2 is a cross-sectional diagram showing a status before hot-pressing in a liquid crystal display device shown in FIG. 1.

Next, a manufacturing method for realizing the above-mentioned connection structure is explained with reference to FIGS. 2 and 3. FIG. 2 is a cross-sectional diagram showing a status before hot-pressing in a liquid crystal display device shown in FIG. 1. And, FIG. 3 is a cross-sectional diagram showing a connection method at time of hot-pressing in a liquid crystal display device shown in FIG. 1.

First, as shown in FIG. 2, the anisotropic conductive film 5 not only is stuck in the area where the liquid crystal panel 3 and the flexible wiring board 4 overlap but also protrudes to the outside portion or area (right side of FIG. 2) of the edge of the liquid crystal panel 3. The anisotropic conductive film 5 protrudes to the outside at the length of d3 from the edge of the liquid crystal panel 3 and extends to a position where the anisotropic conductive film 5 overlaps with a part of the insulating protection film 4a of the flexible wiring board 4. That is, the anisotropic conductive film 5 has an overlapping margin d2, 0.1 to 0.5 mm. Also, the anisotropic conductive film 5 extends at the length of d1 from an end of the flexible wiring board 4 so that an exposed wiring pattern in the end of the flexible wiring board 4 is protected from a electrical short. And the flexible wiring board 4 is attached on the anisotropic conductive film 5 at position aligned with the external connection terminals 11 of the liquid crystal panel 3.

Figure 3:
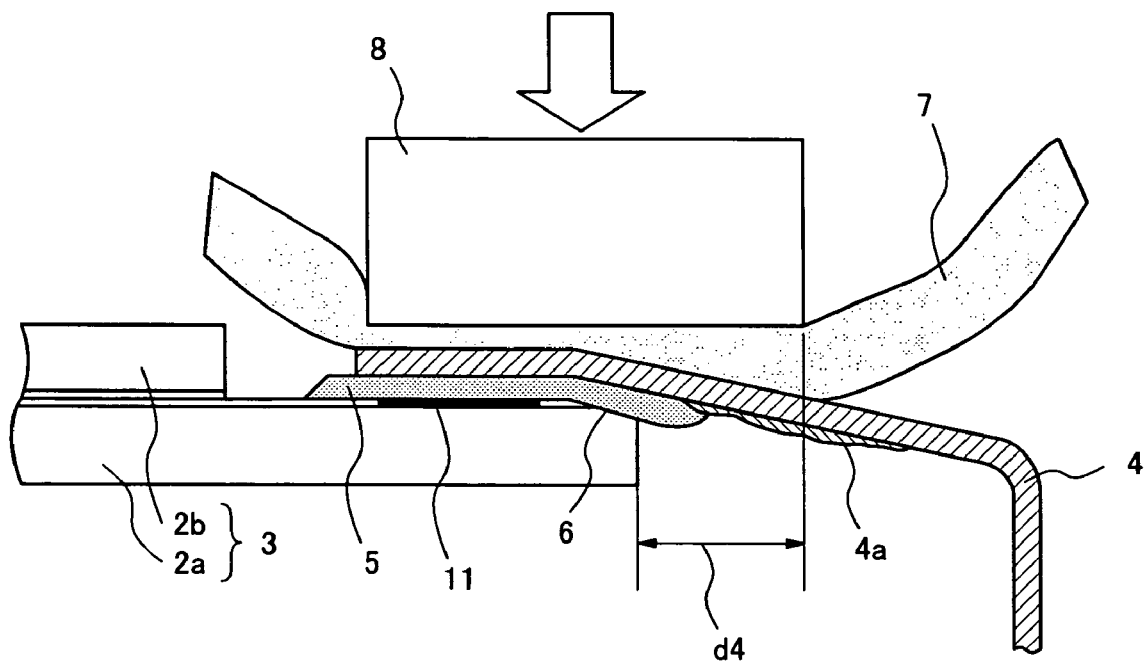
FIG. 3 is a cross-sectional diagram showing a connection method at time of hot-pressing in a liquid crystal display device shown in FIG. 1.
Figure 7:
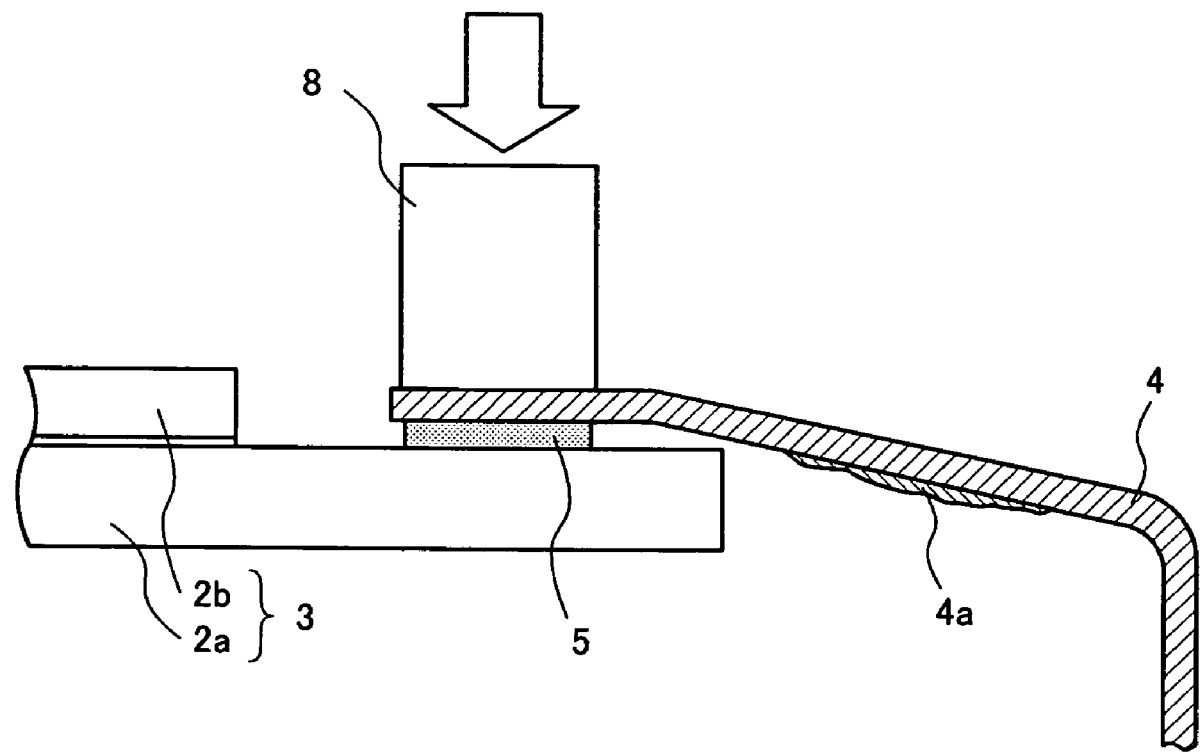
FIG. 7 is a sectional pattern diagram showing a connection method at the time of hot-pressing in a liquid crystal display device shown in FIG. 6.

Next, FIG. 3 shows a state that a cushioning 7 is attached on the aligned flexible wiring board 4 and hot-pressing is performed on top of the cushioning 7 by using a hot-pressing tool 8. In a conventional manufacturing method, as shown in FIG. 7, the anisotropic conductive film 5 is stuck only on a formation area of the external connection terminals 11 of the liquid crystal panel 3, and the hot-pressing tool 8 is applied only on top of the anisotropic conductive film 5. In response, in the exemplary manufacturing method of the according to the exemplary embodiment of the present invention, since the anisotropic conductive film 5 extends to the outside from the edge of the liquid crystal panel 3, the hot-pressing tool 8 is applied to not only the formation area of the external connection terminals 11 of the liquid crystal panel 3 but also outside of the liquid crystal panel 3. There is a hot-pressing 8 protruding at the length of d4 in the outside from the edge of the liquid crystal panel 3. Thereby, hot-pressing is performed to the whole area of the stuck anisotropic conductive film 5.

Then, the anisotropic conductive film 5 is hardened by the hot-pressing, and the liquid crystal panel 3 and the flexible wiring board 4 are connected electrically and mechanically. At this time, the flexible board 4 is somewhat depressed by thermo-elastic deformation of the cushioning 7 positioning the outside of the liquid crystal panel 3. Therefore, by depressing the flexible wiring board 4 outside the liquid crystal panel 3, the flexible wiring board 4 is bended along the chamfer 6 and is bonded to the chamfer 6 of the liquid crystal panel by using the anisotropic conductive film 5. Moreover, since the anisotropic conductive film 5 extends from the edge of the liquid crystal panel 3 to the outside position where the insulating protection film 4a is formed, the exposed wiring pattern of the flexible wiring board 4 can be completely covered by the anisotropic conductive film 5.

In addition, the hot-press tool 8 has a size which covers not only the area where the liquid crystal panel 3 and the flexible wiring board 4 overlap but also the outside portion or area of the edge of the liquid crystal panel 3. Other than the size of the hot-press tool 8, for example, form, size, base material, amount of protrusion to the outside from the edge of the liquid crystal panel 3 are not limited to the composition of FIG. 3. Moreover, as for a method of hot-pressing, conditions of heating or pressurization can be set suitably according to the anisotropic conductive film 5. As for the cushioning 7, base material, form, and thickness are not limited, except for reasonably changing in shape and applying uniform power to the flexible wiring board 4.

Figure 4:
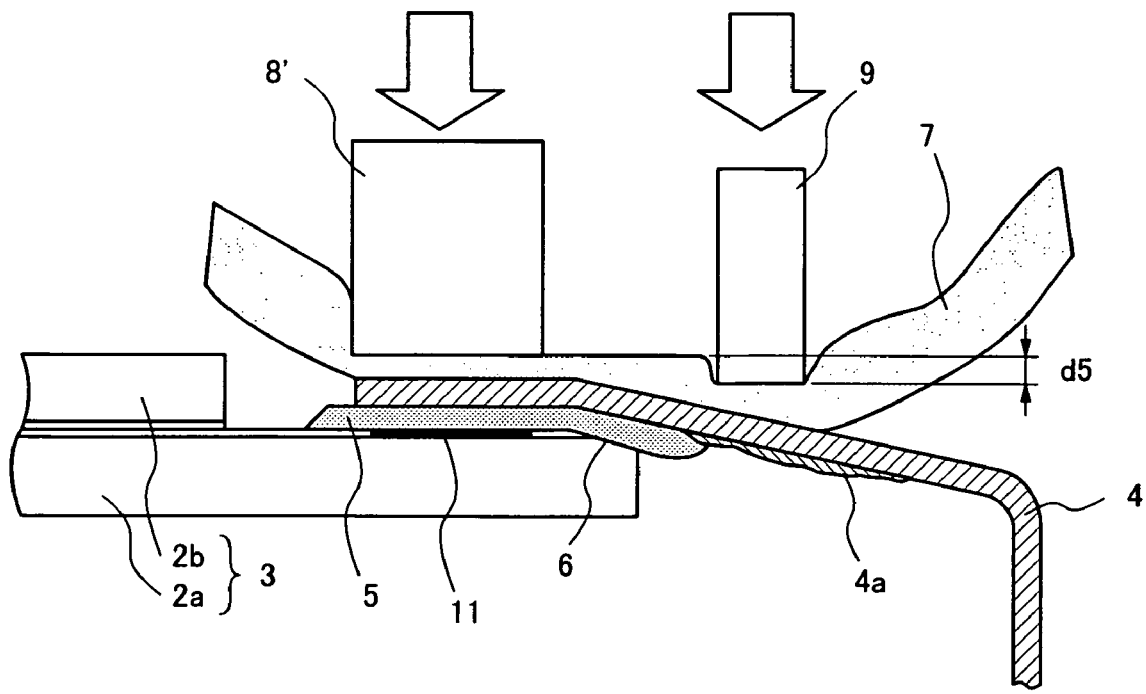
FIG. 4 is a cross-sectional diagram showing another exemplary embodiment of a connection method at the time of hot-pressing bonding a liquid crystal panel and a flexible wiring board in a liquid crystal display device according to the embodiment.

Next, a description will be given about another embodiment according to the present invention. FIG. 4 is a cross-sectional diagram showing another exemplary embodiment of a connection method at the time of hot-pressing bonding a liquid crystal panel and a flexible wiring board in a liquid crystal display device according to the embodiment.

Referring to FIG. 4, it is possible to use a hot-pressing tool 8' and a pressing tool 9 for depressing the flexible wiring board 4 in place of the large hot-pressing tool 8 used in FIG. 3. That is, the hot pressing tool 8' hot-presses only top of the liquid crystal panel 3, and the pressing tool 9 depresses the flexible wiring board 4 on the outside of the liquid crystal panel 3.

As shown in FIG. 4, the anisotropic conductive film 5 is stuck on the predetermined position of the liquid crystal panel 3, and the flexible wiring board 4 is attached at aligned positioning on the liquid crystal panel 3. The hot-pressing tool 8' is set upside the external connection terminals 11 of the liquid crystal panel 3, and the pressing tool 9 is set upside the flexible wiring board 4 of the outside of the liquid crystal panel 3. Subsequently, while case-hardening the anisotropic conductive film 5 by using the hot-pressing tool 8', the flexible wiring board 4 is mechanically depressed below the surface of the liquid crystal panel 3 by using the pressing tool 9.

Herewith, the flexible wiring board 4 is bended along inclination of the chamfer 6, and an exposed portion of the wiring pattern of the flexible wiring board. 4 is covered completely by the anisotropic conductive film 5, also the anisotropic conductive film 5 covers from the formation area of the external connection terminals 11 to the position of the insulating protection film 4a.

As shown in FIG. 3, even if the flexible wiring board 4 has high flexural modulus (hard to bend), the flexible wiring board 4 can be bent along the chamfer 6, and it is possible to attain high accuracy of positioning.

Figure 5:
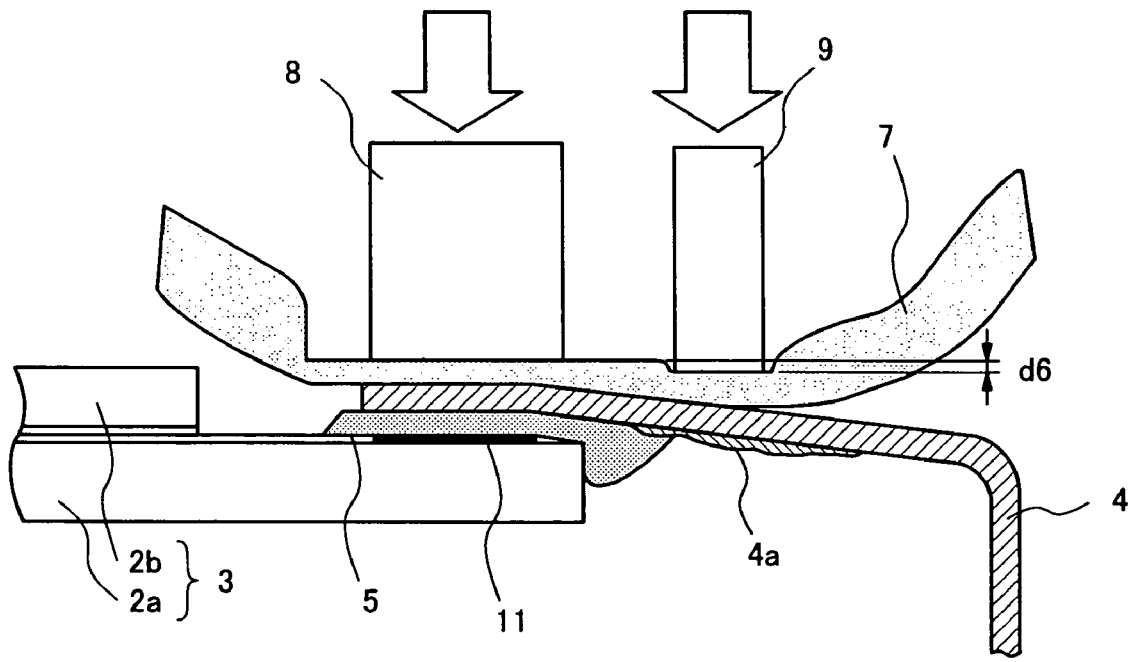
FIG. 5 is a cross-sectional diagram showing a connection method in case of no chamfer in the embodiment shown in FIG. 4.
Figure 6:
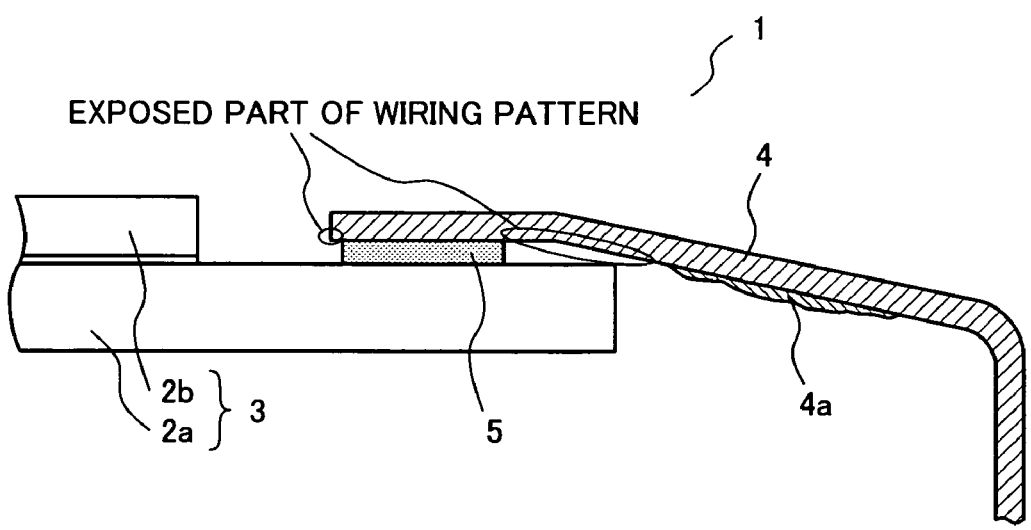
FIG. 6 is a cross-sectional diagram showing a connection structure bonding a liquid crystal panel and a flexible wiring board in a conventional liquid crystal display device.

Next, a description will be given about another exemplary embodiment according to the present invention. FIG. 5 is a cross-sectional diagram showing a connection method in case of no chamfer in the embodiment shown in FIG. 4.

In FIG. 4, if there is no chamfer at a periphery of the liquid crystal panel 3 and the flexible wiring board 4 is depressed strongly, the flexible wiring board 4 contacts to the edge of the liquid crystal panel 3 and there may be a problem that a wiring pattern disconnect will arise.

As shown in FIG. 5, in the exemplary embodiment according to the present invention, a rate of depressing by the pressing tool 9 is lessened in comparison with FIG. 4. By using the pressing tool 9 set at a lower rate, pressure is applied to the edge of the liquid crystal panel 3 through the cushioning. Therefore, the liquid crystal panel 3 and the flexible wiring board 4 are certainly bonded.

As mentioned above, the exemplary liquid crystal display device according to the present invention can solve the problems of disconnection and electrical short.

Namely, when bonding the liquid crystal panel 3 and the flexible wiring board 4, the anisotropic conductive film 5 is stuck on the formation area of the external connection terminals 11 and protrudes to the outside area from the edge of the liquid crystal panel 3 along the direction of the flexible wiring board 4.

As shown in FIG. 3, the anisotropic conductive film 5 protrudes to the outside from the edge of the liquid crystal panel 3, and is extended to the position where anisotropic conductive film 5 overlaps with a part of the insulating protection film 4a of the flexible wiring board 4. Further, the anisotropic conductive film 5 is stuck on the inside or periphery of the external connection terminals 11 of the liquid crystal panel 3.

From this, since the wiring pattern which is not covered by the insulating protection film 4a can be completely covered by the anisotropic conductive film 5, electrical short resulting from adhesion of a conductive foreign substance and disconnection resulting from contact to the edge of the liquid crystal panel 3 can be prevented certainly. Moreover, the contact surface product of a liquid crystal panel 3 and the flexible wiring board 4 can be made large, and bond strength can be enhanced.

Moreover, it is possible not only to hot-press the terminal-forming area of the liquid crystal panel 3 by using the hot-pressing tool 8' but also to depress the outside of the flexible wiring board 4 by using the pressing tool 9. Hereby, even if the liquid crystal panel 3 is the structure of having the chamfer 6, it is possible to bend and sticks the flexible wiring board 4 along the chamfer 6, and to enhance bond strength.

In addition, the present invention is applicable to liquid crystal display devices of arbitrary drive system with TN (Twisted Nematic), VA (Vertical Alignment), IPS (In-Place-Switching) and so on. The present invention is applicable to liquid crystal display devices with any of staggered (top gate) structure or inversely staggered (bottom gate) structure. Moreover, the present invention is applicable to not only a liquid crystal display device but arbitrary display devices having the composition to which a display panel and a flexible wiring board are connected.

The previous description of embodiments is provided to enable a person skilled in the art to make and use the present invention.

Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is noted that the inventor's intent is to retain all equivalents of the claimed invention even if the claims are amended during prosecution. This application is based on Japanese Patent Application No. JP 2006-013822 filed on Jan. 23, 2006, and including a specification, claims, drawings and summary. The disclosure of the above Japanese Patent Application is incorporated herein by reference in its entirety.

What is claimed is:

1. A liquid crystal display device, comprising:
   a liquid crystal panel which is provided with a substrate, a liquid crystal, and external connection terminals formed on the substrate;
   a flexible wiring board which includes a wiring pattern connected with the external connection terminals of the liquid crystal panel;
   an anisotropic conductive film which electrically connects between the external connection terminals of the liquid crystal panel and the wiring pattern of the flexible wiring board, and which is extended from a formation area of the external connection terminals to an outside area of the liquid crystal panel; and
   an insulating protection film coated on the flexible wiring board to keep a predetermined distance from an edge of the liquid crystal panel, the anisotropic conductive film overlapping with a part of the insulating protection film,
   wherein said predetermined distance prevents said insulating protection film from overlapping with said liquid crystal panel in a direction perpendicular to an extension of the substrate.

2. The liquid crystal display device according to claim 1, wherein the anisotropic conductive film is extended from an edge of the flexible wiring board to an inside area of the liquid crystal panel.

3. The liquid crystal display device according to claim 1, wherein the flexible wiring board and the liquid crystal panel are connected by thermo compression bonding using the anisotropic conductive film.

4. A manufacturing method for connecting a flexible wiring board in a liquid crystal display device, said manufacturing method comprising:
   setting a liquid crystal panel which is provided with a substrate, a liquid crystal, and external connection terminals formed on the substrate;
   sticking an anisotropic conductive film on a formation area of the external connection terminals;
   attaching a flexible wiring board on the anisotropic conductive film at a position aligned with the external connection terminals of the liquid crystal panel;
   attaching a cushioning on the flexible wiring board;
   setting a hot-pressing tool above the cushioning;
   thermo-compressing a stuck area of the anisotropic conductive film by using the hot-pressing tool; and
   coating an insulating protection film on the flexible wiring board to keep a predetermined distance from an edge of the liquid crystal panel,
   wherein the anisotropic conductive film is formed from a formation area of the external connection terminals to an outside area along the flexible wiring board, and
   wherein the anisotropic conductive film is extended to an outside area of the edge of the liquid crystal panel and overlaps with a part of the insulating protection film, and wherein said predetermined distance prevents said insulating protection film from overlapping with said liquid crystal panel in a direction perpendicular to an extension of the substrate.

5. The manufacturing method according to claim 4, wherein the anisotropic conductive film is extended from an edge of the flexible wiring board to an inside of the liquid crystal panel.

6. The manufacturing method according to claim 4, further comprising forming a chamfer outside the formation area of the external connection terminals in a periphery of the substrate,
wherein the anisotropic conductive film is extended along the chamfer from the formation area of the external connection terminals of the liquid crystal panel and is stuck to the chamfer.

7. A manufacturing method for connecting a flexible wiring board in a liquid crystal display device, said manufacturing method comprising:
setting a liquid crystal panel which is provided with a substrate, a liquid crystal, and external connection terminals formed on the substrate;
sticking an anisotropic conductive film on a formation area of the external connection terminals;
attaching a flexible wiring board on the anisotropic conductive film at a position aligned with the external connection terminals of the liquid crystal panel;
attaching a cushioning on the flexible wiring board;
setting a hot-pressing tool above the cushioning at inside the liquid crystal panel;
setting a pressing tool above the cushioning at outside the liquid crystal panel;
thermo-compressing a stuck area of the anisotropic conductive film; and
coating an insulating protection film on the flexible wiring board to keep a predetermined distance from an edge of the liquid crystal panel,
wherein the anisotropic conductive film is formed from a formation area of the external connection terminals to an outside area along the flexible wiring board, and
wherein the anisotropic conductive film is extended to an outside area of the edge of the liquid crystal panel and overlaps with a part of the insulating protection film, and
wherein said predetermined distance prevents said insulating protection film from overlapping with said liquid crystal panel in a direction perpendicular to an extension of the substrate.

8. The manufacturing method according to claim 7, wherein a thermo-compressing is performed so that the flexible wiring board is mechanically depressed below the surface of the liquid crystal panel by using the pressing tool while case-hardening the anisotropic conductive film by using the hot-pressing tool.

9. The manufacturing method according to claim 7, wherein the anisotropic conductive film is extended from an edge of the flexible wiring board to an inside of the liquid crystal panel.

10. The manufacturing method according to claim 7, further comprising:
forming a chamfer outside the formation area of the external connection terminals in a periphery of the substrate,
wherein the anisotropic conductive film is extended along the chamfer from the formation area of the external connection terminals of the liquid crystal panel and is stuck to the chamfer.

11. The liquid crystal display device according to claim 1, further comprising:
a chamfer which is formed outside the formation area of the external connection terminals in a periphery of the substrate,
wherein the anisotropic conductive film is extended along the chamfer and is stuck to the chamfer.

12. The liquid crystal display device according to claim 1, wherein said anisotropic conductive film extends beyond the liquid crystal panel, said outside area being distanced away from the liquid crystal panel in a direction of an extension of the anisotropic conductive film.

13. The liquid crystal display device according to claim 1, wherein said anisotropic conductive film overlaps with the part of the insulating protection film in a location in said outside area such that said location does not overlap with said liquid crystal panel in a direction perpendicular to an extension of the substrate.

14. The manufacturing method according to claim 4, wherein said anisotropic conductive film extends beyond the liquid crystal panel, said outside area being distanced away from the liquid crystal panel in a direction of an extension of the anisotropic conductive film.

15. The manufacturing method according to claim 4, wherein said anisotropic conductive film overlaps with the part of the insulating protection film in a location in said outside area such that said location does not overlap with said liquid crystal panel in a direction perpendicular to an extension of the substrate.

16. The manufacturing method according to claim 7, wherein said anisotropic conductive film extends beyond the liquid crystal panel, said outside area being distanced away from the liquid crystal panel in a direction of an extension of the anisotropic conductive film.

17. The manufacturing method according to claim 7, wherein said anisotropic conductive film overlaps with the part of the insulating protection film in a location in said outside area such that said location does not overlap with said liquid crystal panel in a direction perpendicular to an extension of the substrate.

* * * * *